(12) United States Patent
Sano

(10) Patent No.: US 11,527,469 B2
(45) Date of Patent: Dec. 13, 2022

(54) SEMICONDUCTOR DEVICE

(71) Applicant: Kioxia Corporation, Tokyo (JP)

(72) Inventor: Yuichi Sano, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/007,532

(22) Filed: Aug. 31, 2020

(65) Prior Publication Data

US 2021/0296224 A1 Sep. 23, 2021

(30) Foreign Application Priority Data

Mar. 17, 2020 (JP) .............................. JP2020-046190

(51) Int. Cl.
*H01L 23/498* (2006.01)
*H01L 25/18* (2006.01)
*H01L 23/00* (2006.01)

(52) U.S. Cl.
CPC .. *H01L 23/49838* (2013.01); *H01L 23/49822* (2013.01); *H01L 24/32* (2013.01); *H01L 25/18* (2013.01); *H01L 2224/32225* (2013.01)

(58) Field of Classification Search
CPC ................. H01L 25/0657; H01L 25/50; H01L 2224/32225; H01L 23/49822; H01L 23/49838; H01L 24/32; H01L 23/49827; H01L 25/18
See application file for complete search history.

(56) References Cited

U.S. PATENT DOCUMENTS

| | | | |
|---|---|---|---|
| 9,117,770 | B2 | 8/2015 | Sakamoto |
| 2010/0072604 | A1 | 3/2010 | Komatsu et al. |
| 2018/0033731 | A1 | 2/2018 | Betsui et al. |
| 2018/0047696 | A1* | 2/2018 | Yamada ............ H01L 23/49822 |
| 2018/0253375 | A1 | 9/2018 | Arai |

FOREIGN PATENT DOCUMENTS

| | | |
|---|---|---|
| JP | 3497464 B2 | 2/2004 |
| JP | 4347506 B2 | 10/2009 |
| JP | 2013-183002 A | 9/2013 |
| TW | 201603222 A | 1/2016 |
| TW | 201712845 A | 4/2017 |

* cited by examiner

*Primary Examiner* — Jasmine J Clark

(74) *Attorney, Agent, or Firm* — Foley & Lardner LLP

(57) ABSTRACT

A semiconductor device includes: a multilayer wiring substrate including a plurality of wiring layers; a first semiconductor chip disposed on the wiring substrate; and a bonding layer bonding the first semiconductor chip to the wiring substrate. A trace formed on the wiring substrate includes a first trace width portion and a second trace width portion, a width of the first trace width portion being greater than the second trace width portion.

10 Claims, 4 Drawing Sheets

SEMICONDUCTOR DEVICE

CROSS-REFERENCE TO RELATED APPLICATION(S)

This application is based upon and claims the benefit of priority from Japanese Patent Application No. 2020-046190, filed Mar. 17, 2020, the entire contents of which are incorporated herein by reference.

FIELD

Embodiments described herein relate generally to semiconductor devices.

BACKGROUND

Semiconductor devices, such as a semiconductor storage device, having a structure in which a plurality of semiconductor chips are stacked and encapsulated in one package to achieve, for example, miniaturized and faster semiconductor devices with higher functionality are in practical use. The semiconductor storage device has a structure in which, for example, a controller chip is bonded to a wiring substrate by a film on device (FOD) material, in which the controller chip is embedded, and memory chips are stacked on the FOD material in multiple tiers.

In such a semiconductor device, the number of stacked memory chips has been increasing. In the semiconductor device provided with the FOD material on which the memory chips are stacked in multiple tiers, a crack may appear in a portion of the FOD material where stress concentration occurs due to thermal stress or the like.

On the other hand, for a high-speed trace such as Peripheral Component Interconnect Express (PCIe), impedance control is required to allow a signal whose frequency is 1 GHz or higher, for example, to flow therethrough, which makes it difficult to increase the trace width to make it less likely to be affected by the crack.

DETAILED DESCRIPTION

Figure 1:
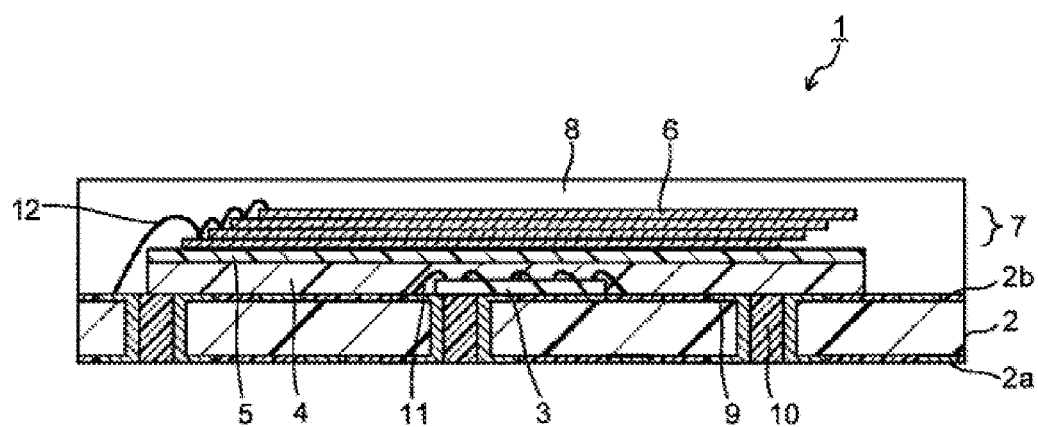
FIG. 1 is a sectional view showing the structure of a semiconductor device according to at least one embodiment.

At least one embodiment provides a semiconductor device that makes it possible to reduce the influence caused by a crack in a bonding layer which bonds a semiconductor chip to a wiring substrate even when a high-speed trace that requires impedance control is used in the semiconductor device.

In general, according to at least one embodiment, a semiconductor device includes: a multilayer wiring substrate including a plurality of wiring layers; a first semiconductor chip disposed on the wiring substrate; and a bonding layer bonding the first semiconductor chip to the wiring substrate, and a trace formed on the wiring substrate includes a first trace width portion and a second trace width portion, a width of the first trace width portion being greater than a width of the second trace width portion.

Hereinafter, at least one embodiment will be described with reference to the drawings. Substantially identical elements are denoted by the same reference sign in the drawings and a part of an explanation thereof is sometimes omitted. The drawings are schematic drawings, and the relationship between the thickness and the planar size, the thickness ratio between portions, and the like are sometimes different from the actual relationship, thickness ratio, and the like. Unless otherwise specified, terms indicating directions such as "on", "above", "under", and "below" in the description indicate relative directions when a substrate, which will be described later, is put with a semiconductor chip placement surface thereof facing upward and are sometimes different from the actual directions with respect to the direction of acceleration of gravity.

FIG. 1 is a sectional view showing a semiconductor device (e.g., a semiconductor package) according to the embodiment. A semiconductor package 1 includes a wiring substrate 2, a first semiconductor chip 3 placed on the wiring substrate 2, a first bonding layer (e.g., an FOD material) 4 that bonds the first semiconductor chip 3 to the wiring substrate 2 with the first semiconductor chip 3 embedded in the first bonding layer 4, a stacked body 7 including a plurality of third semiconductor chips 6 and firmly adhering to a second semiconductor chip 5 that is bonded to the first bonding layer 4 and does not include an electrode, and a sealing resin layer 8 that is provided on the wiring substrate 2 so as to encapsulate the first semiconductor chip 3, the stacked body 7 including the third semiconductor chips 6, and the like therein. The second semiconductor chip 5 is a spacer substrate and a silicon wafer is used as the spacer substrate; in addition thereto, a plate of resin such as polyimide, glass, or the like may be used as the spacer substrate.

The wiring substrate 2 includes a wiring network configured with a wiring layer 9 provided on the surface of, for example, an insulating resin substrate or an insulating ceramic substrate, a wiring layer 10 provided in such a substrate, and the like; specifically, examples of the wiring substrate 2 include a printed wiring board using insulating resin such as glass-epoxy resin. The wiring layers 9 and 10 are made of a metallic material such as copper, a copper alloy, gold, or a gold alloy. The wiring substrate 2 has a first surface 2a which is, for example, a surface on which an external terminal will be formed and a second surface 2b which is a surface on which the semiconductor chips 3, 5, and 6 will be placed.

The first semiconductor chip 3 is placed on the second surface 2b of the wiring substrate 2, and the first semiconductor chip 3 is embedded in the first bonding layer 4 and bonded to a chip placement region of the wiring substrate 2. Examples of the first semiconductor chip 3 include, but are not limited to, a controller chip that transmits and receives a digital signal between a semiconductor memory chip, which is used as the third semiconductor chip 6, and an external apparatus, a system LSI chip such as an interface chip, a logic chip, or an RF chip.

An electrode (which is not shown in FIG. 1) of the first semiconductor chip 3 is electrically connected to the wiring layer 9 of the wiring substrate 2 via a bonding wire 11. By placing the first semiconductor chip 3 (such as a controller chip) directly on the wiring substrate 2, it is possible to shorten the wiring length between the first semiconductor chip 3 and the wiring substrate 2. This enhances, for example, the rate of signal transfer between the first semiconductor chip 3 and the wiring substrate 2, which allows the semiconductor package 1 to adapt to faster speeds. Furthermore, since the first semiconductor chip 3 is embedded in the first bonding layer 4, there is no possibility that the first semiconductor chip 3 will make it difficult to place the third semiconductor chips 6 on the wiring substrate 2 and to achieve a reduction in package size, for example. Therefore, it is possible to provide the semiconductor package 1 that is relatively small in size and designed for use in a high-speed device.

The outside shape of the first semiconductor chip 3 such as a controller chip is usually smaller than that of the third semiconductor chip 6 such as a semiconductor memory chip. For this reason, after the first semiconductor chip 3 placed on the wiring substrate 2 is embedded in the first bonding layer 4, the plurality of third semiconductor chips 6 are stacked and placed on the first bonding layer 4. Specific examples of the third semiconductor chip 6 include, but are not limited to, a semiconductor memory chip such as NAND flash memory. In the at least one embodiment, four semiconductor memory chips are stacked and placed as the third semiconductor chips 6. The number of stacked third semiconductor chips 6 is not limited to four.

Of the plurality of third semiconductor chips 6 placed on the first bonding layer 4, the third semiconductor chips 6 in the first to fourth tiers are stacked in a staircase pattern with ends of the third semiconductor chips 6, where electrodes thereof are disposed, displaced in a first direction (to the right in the plane of the paper in FIG. 1) such that these electrodes are exposed.

Among the plurality of third semiconductor chips 6, the third semiconductor chip 6 in the first tier firmly adheres to the first bonding layer 4 with the second semiconductor chip 5 without an electrode sandwiched therebetween. For the third semiconductor chips 6, a common adhesive such as die attach film (DAF) is used, and an adhesive such as DAF, which is not shown in FIG. 1, makes one third semiconductor chip 6 firmly adhere to another third semiconductor chip 6 located under the one third semiconductor chip 6. The electrodes (which are not shown in FIG. 1) of the third semiconductor chips 6 are electrically connected to the wiring layer 9 of the wiring substrate 2 via a bonding wire 12. When electrode pads are the same in electrical characteristics and signal characteristics, the wiring layer 9 of the wiring substrate 2 and the electrode pads of the plurality of third semiconductor chips 6 can be connected in sequence by the bonding wire 12. That is, the electrodes of the third semiconductor chips 6 in the first to fourth tiers are connected in sequence by the bonding wire 12, and the electrode of the third semiconductor chip 6 in the first tier and the wiring layer 9 of the wiring substrate 2 are connected by the bonding wire 12. The thickness of the third semiconductor chip 6 is from 30 to 100 µm, for example.

The sealing resin layer 8 using insulating resin such as epoxy resin is, for example, molded on the second surface 2b of the wiring substrate 2 in such a way as to encapsulate the first semiconductor chip 3 and the stacked body 7 including the third semiconductor chips 6 therein along with the bonding wires 11 and 12. The semiconductor package 1 of at least one embodiment includes these components.

Figure 2:
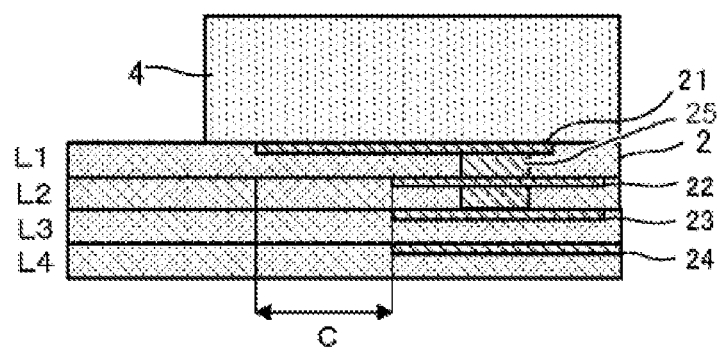
FIG. 2 is a sectional view showing the structure of a principal portion of a wiring substrate according to at least one embodiment.

Next, the structure of the wiring substrate 2 of the semiconductor package 1 will be described with reference to FIG. 2. FIG. 2 shows the cross-sectional structure of the wiring substrate 2 and a region near an end of the first bonding layer 4. As shown in FIG. 2, the wiring substrate 2 is a multilayer wiring substrate 2 including four wiring layers: a first layer L1, a second layer L2, a third layer L3, and a fourth layer L4.

On the first layer L1, a trace 21 made of metal, for example, copper is formed. Likewise, a trace 22, a trace 23, and a trace 24 are formed on the second layer L2, the third layer L3, and the fourth layer L4, respectively. In the region, which is indicated by a sign C in FIG. 2, near the end of the first bonding layer 4, the trace 21 is formed on the first layer L1 and a trace is not formed on the second layer L2, the third layer L3, and the fourth layer L4. In the region near the end of the first bonding layer 4, a crack appears in the first bonding layer 4 more easily than in a region other than the region near the end of the first bonding layer 4, that is, a central region or the like of the first bonding layer 4.

Figure 3:
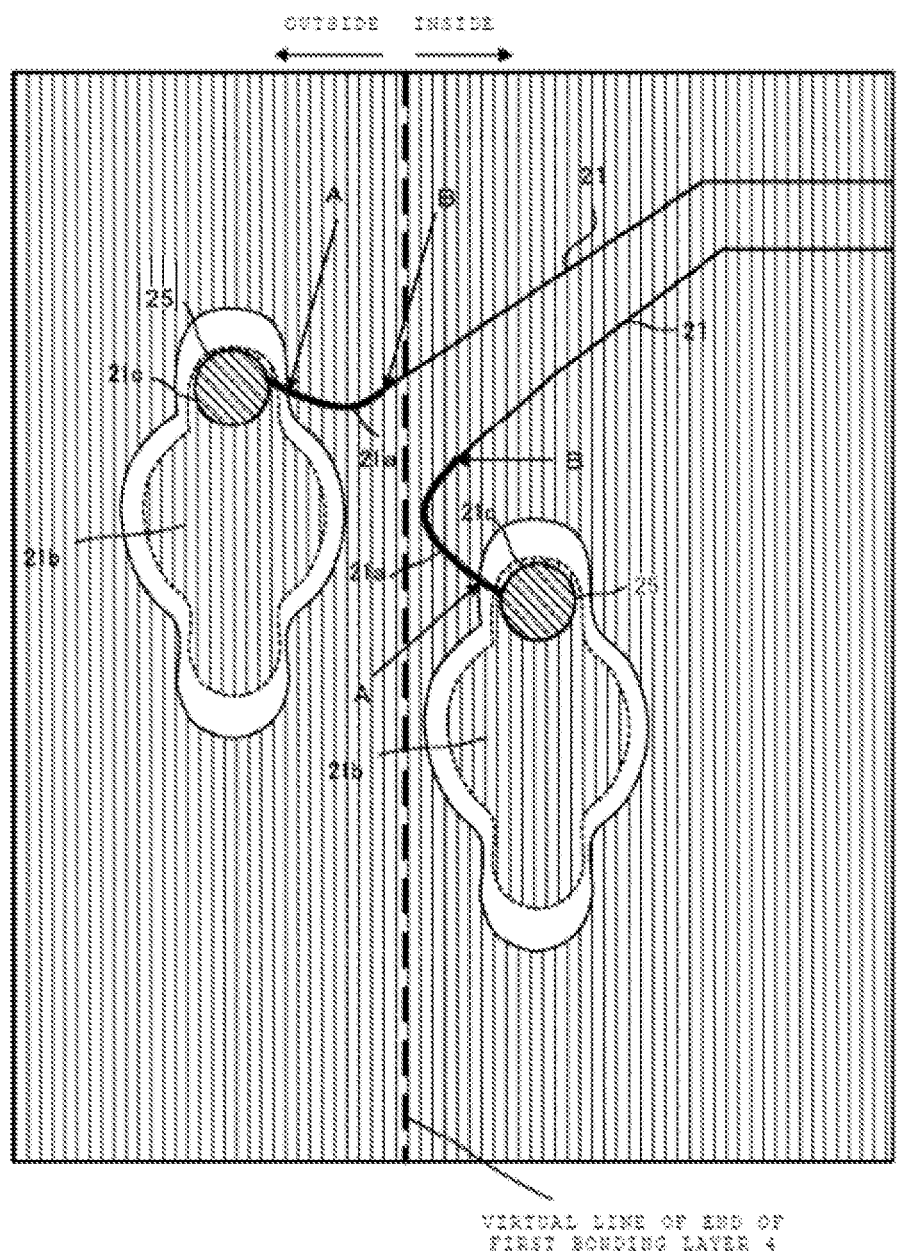
FIG. 3 is a plan view showing the structure of a principal portion of the wiring substrate according to at least one embodiment.

FIG. 3 is a schematic plan view showing the wiring configuration of the wiring substrate 2. A portion where some kind of metal wiring pattern is present when all the layers from the first to fourth layers L1 to L4 are stacked is shown by vertical lines. While only two traces 21 are shown in FIG. 3 for the sake of simplicity, a large number of traces 21 are provided on the actual wiring substrate 2. The trace 21 and a land extension portion 21c are provided on the first layer L1. The trace 21 is connected to the land extension portion 21c of a land 21b. Moreover, in a portion of the trace 21 where an end thereof connected to the land extension portion 21c is located, a thick (first or relatively thicker) trace width portion 21a whose trace width is thicker than that of the other portion of the trace 21 (a second or relatively thinner trace width portion) is provided.

In lands of the second layer L2 and the third layer L3, a via 25 connecting to the land extension portion 21c in a vertical direction is provided. The land 21b of the fourth layer L4 is shown by a dotted line. The position of the end of the first bonding layer 4 is shown by a dashed line. The dashed line indicates the boundary between the inside and the outside of the first bonding layer 4. In at least one embodiment, the trace width of the trace 21 is set at 30 µm, for example, and the trace width of the thick trace width portion 21a is set at 50 µm, for example. The trace width of the thick trace width portion 21a may be from 40 to 60 µm, for example. The thick trace width of the thick trace width portion 21a is a trace width intentionally designed to be thick, and a trace width that is thicker than that of the other portion by about a few microns, for example, due to a production error or the like is not included therein. A solder ball or the like for connection to the outside is provided on the land 21b of the fourth layer L4.

Moreover, the trace 21 formed on the first layer L1 is a high-speed trace such as Peripheral Component Interconnect Express (PCIe), which is a trace that allows a signal whose frequency is 1 GHz or higher, for example, to flow therethrough and requires impedance control. For this reason, the trace width of the trace 21 is limited in order to achieve required electrical performance. In at least one embodiment, if the trace width of the trace 21 is set at 35 µm, for example, a part of the required electrical performance is not satisfied; therefore, as described above, the trace width of the trace 21 is set at 30 µm, for example. This trace width is one example and the trace width of the trace 21 is not limited thereto. The trace 21 connects to the first semiconductor chip 3. Other unillustrated signal lines and the like are provided on the first layer L1. The frequency of a signal flowing through the signal line is lower than the frequency of a signal flowing through the trace 21.

In the region indicated by C in FIG. 2, a metal trace is not formed on the second layer L2, the third layer L3, and the fourth layer L4. In FIG. 3, a region where a metal trace is not formed on the first layer L1, the second layer L2, the third layer L3, and the fourth layer L4 as just described is shown as a white blank region. As shown in FIG. 3, the region where a trace is not present on the first layer L1 (excluding the trace 21), the second layer L2, the third layer L3, and the fourth layer L4 surrounds a region where the land 21b of the fourth layer L4 is formed for, for example, reducing capacitive coupling between these layers and the land 21b.

As described above, when a trace made of metal is not formed on layers (other layers) above and below one layer in a portion, strength as the wiring substrate 2 is reduced in this portion. As a result, when, for example, a crack appears in the first bonding layer 4 bonded to the wiring substrate 2 and stress is applied thereto, the crack sometimes spreads to this portion. In particular, since the first layer L1 is located in the close vicinity of the end of the first bonding layer 4, the stress caused by the appearance of the crack is easily applied directly to the first layer L1.

For this reason, in at least one embodiment, the trace 21 in the white blank region of FIG. 3, where a trace is not formed on the first layer L1, the second layer L2, the third layer L3, and the fourth layer L4, and within a 200-μm radius of a part (a point A shown in FIG. 3) overlapping with a portion where a trace is present on at least one of the first layer L1, the second layer L2, the third layer L3, and the fourth layer L4 (in an area from the point A to a point B shown in FIG. 3) is provided as the thick trace width portion 21a. An area within a 200-μm radius of the part A is the maximum area, and the trace 21 in an area narrower than this area, for example, the trace 21 within a 100-μm radius of the part A may be provided as the thick trace width portion 21a. In particular, in a part other than the region near the end of the first bonding layer 4 where a crack easily appears in the first bonding layer 4, the trace 21 in a narrower area may be provided as the thick trace width portion 21a. For example, in the region near the end of the first bonding layer 4, the trace 21 within a 200-μm radius of the part A may be provided as the thick trace width portion 21a. Further, in a part other than the region near the end of the first bonding layer 4, for example, in a region near the central part of the first bonding layer 4, the trace 21 within a 100-μm radius of the part A may be provided as the thick trace width portion 21a. Alternatively, in apart other than the region near the end of the first bonding layer 4, no thick trace width portion 21a may be formed.

In other words, the trace 21 extending from the land extension portion 21c of the land 21b formed in a region, where a trace is not present on the layers above and below one layer, of the wiring substrate 2 within a 200-μm radius of the part An overlapping with a portion where traces are present on the layers above and below one layer is provided as the thick trace width portion 21a. This makes it possible to reinforce the wiring substrate 2 with the thick trace width portion 21a in a portion where the strength of the wiring substrate 2 is reduced.

Traces on the layers above and below one layer in the above-described part A overlapping with a portion where traces are present on the layers above and below one layer are often ground wiring acting as a noise shield between layers, and power supply wiring, signal wiring on other layers, and the like are also included therein. However, a floating metal pattern that is formed like a circular island, for example, and is not electrically connected to another trace is not included therein.

As described above, by providing the thick trace width portion 21a in a part of the trace 21, even a trace, such as wPCIe, which requires impedance control can achieve electrical performance. As stated earlier, in at least one embodiment, if the overall trace width of the trace 21 is increased, a part of the required electrical performance is not satisfied. This makes it impossible to reinforce the wiring substrate 2 by increasing the overall trace width of the trace 21, and the trace width of the trace 21 is basically set at 30 μm as stated above.

For example, in the case of differential return loss or the like at a frequency of 4 GHz, when, for example, the trace width of the trace 21 is 30 μm, even when the thick trace width portion 21a whose trace width is 50 μm is provided in the above-described area, the required electrical performance can be achieved.

As described above, in the semiconductor package 1 of at least one embodiment, even when the high-speed trace 21 that requires impedance control is used therein, the wiring substrate 2 can be reinforced so that a crack in the first bonding layer 4, which bonds the first semiconductor chip 3 to the wiring substrate 2, does not spread to the wiring substrate 2.

While the above description deals with the first layer L1 of the wiring substrate 2, at least one embodiment can also be applied to a layer other than the first layer L1, for example, the second layer L2, the third layer L3, the fourth layer L4, and the like in a similar manner.

Figure 4:
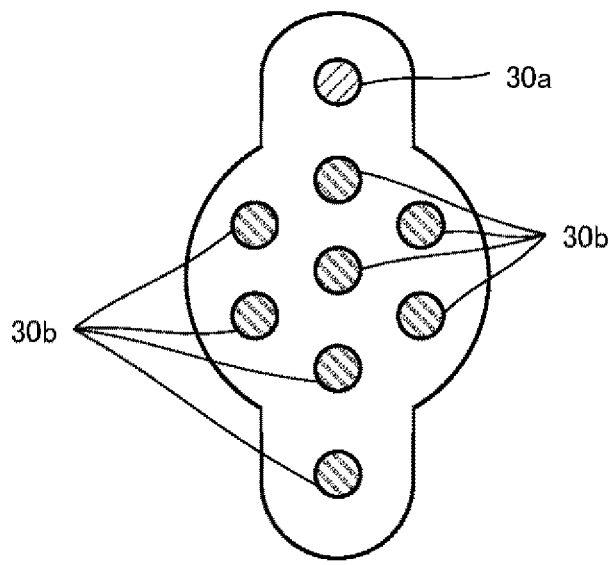
FIG. 4 is a plan view showing the structure of a principal portion of the wiring substrate according to at least one embodiment.
Figure 5:
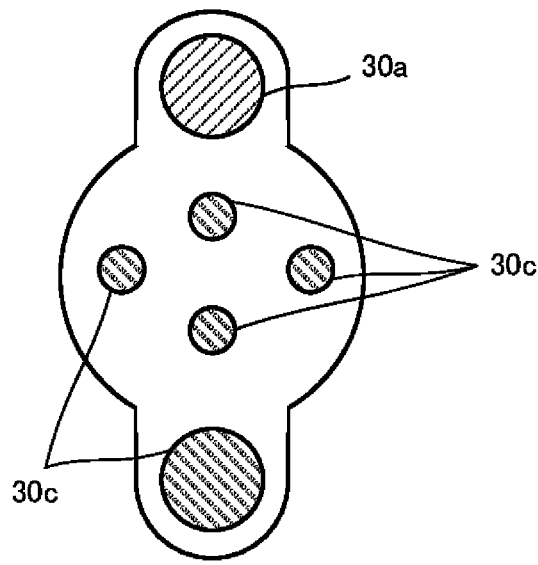
FIG. 5 is a plan view showing the structure of a principal portion of the wiring substrate according to at least one embodiment.

Next, floating metal patterns 30b and 30c that are formed like circular islands, for example, and are not electrically connected to other traces will be described with reference to FIGS. 4 and 5. As described earlier, the white blank region shown in FIG. 3 is a region where a trace is not formed on other layers (in FIG. 3, the first layer L1 (excluding the trace 21), the second layer L2, the third layer L3, and the fourth layer L4). As described above, when a relatively large region where a trace is not formed is present in one layer, a depression or the like sometimes develops in that portion. For this reason, on other layers where a trace is not formed, the floating metal pattern 30b is sometimes located in the white blank region as shown in FIG. 4, for example. It is to be noted that a metal pattern 30a provides continuity from the fourth layer L4 to the land extension portion 21c of the first layer L1.

As for a floating metal pattern which is described as one comparative example, floating metal patterns of similar pattern arrangement and size are provided on layers. In contrast, in at least one embodiment, for example, the floating metal pattern 30b of pattern arrangement and size shown in FIG. 4 is provided on the second layer L2 and the floating metal pattern 30c of pattern arrangement and size shown in FIG. 5 is provided on layers other than the second layer L2, for example, the third layer L3 and the first layer L1.

As described above, by providing the floating metal pattern 30b of one pattern arrangement and size and the floating metal pattern 30c of another pattern arrangement and size on different layers of the wiring substrate 2, it is possible to make smaller a region without a metal pattern in the white blank region when these layers overlap one another. This structure makes it possible to prevent a low-strength part from locally appearing in the wiring substrate 2 and reinforce the wiring substrate 2 in such a way as to prevent a crack in the first bonding layer 4, which bonds the first semiconductor chip 3 to the wiring substrate 2, from spreading to the wiring substrate 2.

Figure 6:
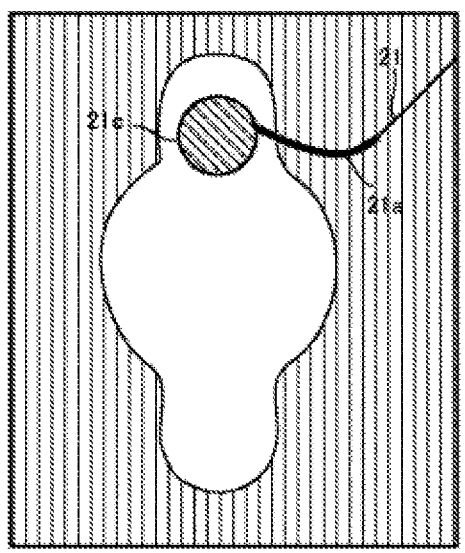
FIG. 6 is a diagram showing a configuration example of a land portion when a floating pattern is not provided.
Figure 6:
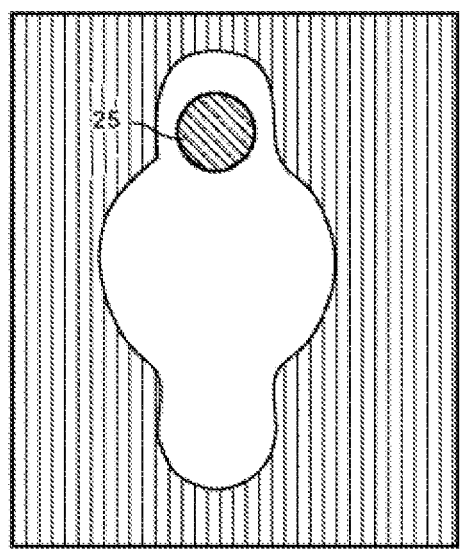
Figure 6:
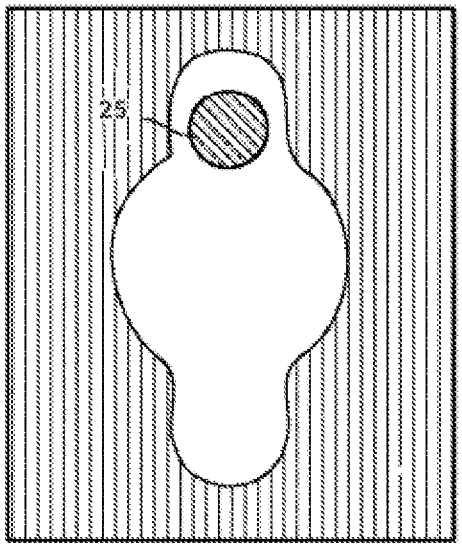
Figure 6:
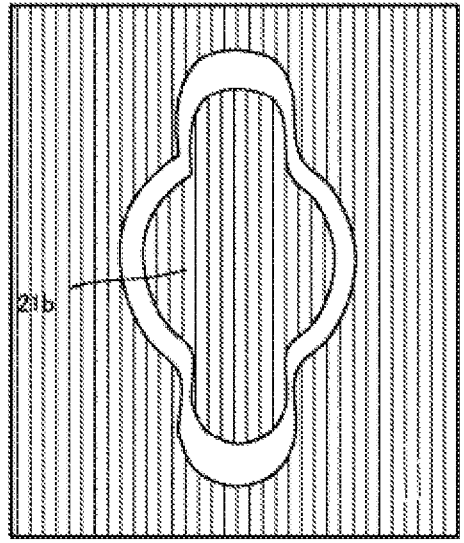

Moreover, as one comparative example, an embodiment of a land portion from the first layer L1 to the fourth layer L4 when a floating pattern is not provided is shown in FIG. 6. Oblique lines or vertical lines indicate that a metal wiring pattern is present. A metal pattern is not placed around a land of the fourth layer L4. The layers from the fourth layer L4 to the first layer L1 are connected through a via. A portion where a metal trace is not placed is large on the first layer L1, the second layer L2, and the third layer L3. This configuration sometimes reduces the strength of the wiring substrate 2.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a multilayer wiring substrate including a plurality of wiring layers;
   a first semiconductor chip disposed on the wiring substrate;
   a bonding layer bonding the first semiconductor chip to the wiring substrate; and
   a first trace formed on the wiring substrate, the first trace including a first portion and a second portion, a first width of the first trace of the first portion being greater than a second width of the first trace of the second portion.

2. The semiconductor device according to claim 1, wherein
   the first trace is configured to allow a signal of 1 GHz or higher to flow through the first trace.

3. The semiconductor device according to claim 1, wherein
   the first portion is disposed only near an end of the bonding layer.

4. The semiconductor device according to claim 1, further comprising:
   a first metal pattern disposed on a first layer of the wiring substrate,
   a second metal pattern disposed on a second layer of the wiring substrate, the first and the second layer located above a third layer on which the land is formed, the first and the second layer overlapping with the land when viewed from a direction perpendicular to a front surface of the wiring substrate,
   the first and the second metal pattern is different from each other.

5. The semiconductor device according to claim 1, wherein
   a width of the first portion is from 40 to 60 μm.

6. The semiconductor device according to claim 1, further comprising:
   a second semiconductor chip disposed above the first semiconductor chip; and
   a third semiconductor chip disposed above the second semiconductor chip.

7. The semiconductor device according to claim 6, wherein the second semiconductor chip includes a spacer substrate.

8. The semiconductor device according to claim 6, wherein the first semiconductor chip is configured to control the third semiconductor chip.

9. The semiconductor device according to claim 6, wherein an outside shape of the first semiconductor chip is less than that of the third semiconductor chip.

10. The semiconductor device according to claim 6, wherein the third semiconductor chip includes a memory chip.

* * * * *